United States Patent
Wu

(10) Patent No.: US 12,323,152 B2
(45) Date of Patent: Jun. 3, 2025

(54) DUTY CYCLE CALIBRATION CIRCUIT AND METHOD

(71) Applicant: MONTAGE TECHNOLOGY (KUNSHAN) CO., LTD., Jiangsu (CN)

(72) Inventor: Zixin Wu, Suzhou (CN)

(73) Assignee: MONTAGE TECHNOLOGY (KUNSHAN) CO., LTD., Suzhou (CN)

(*) Notice: Subject to any disclaimer, the term of this patent is extended or adjusted under 35 U.S.C. 154(b) by 35 days.

(21) Appl. No.: 18/241,518

(22) Filed: Sep. 1, 2023

(65) Prior Publication Data
US 2024/0080022 A1  Mar. 7, 2024

(30) Foreign Application Priority Data
Sep. 2, 2022 (CN) .......................... 202211073889.7

(51) Int. Cl.
*H03K 5/156* (2006.01)
*H03K 5/00* (2006.01)
*H03K 5/135* (2006.01)

(52) U.S. Cl.
CPC ....... *H03K 5/1565* (2013.01); *H03K 5/00006* (2013.01); *H03K 5/135* (2013.01)

(58) Field of Classification Search
CPC .. H03K 5/1565; H03K 5/00006; H03K 5/135; H03K 3/017; H03K 5/156; H03K 7/08; H03K 5/133; G11C 7/22; G11C 11/4076; H03L 7/07; H03L 7/093; H03L 7/0805; H03L 7/099; H03L 7/085; H03L 7/0812; H03L 7/0995; H03L 7/0814; H03L 7/0816; H03L 7/0891; H03L 7/18; H03L 7/091; H03L 7/087
See application file for complete search history.

(56) References Cited

U.S. PATENT DOCUMENTS

| | | | |
|---|---|---|---|
| 2007/0080751 A1* | 4/2007 | Tu | H03L 7/099 331/185 |
| 2014/0266362 A1* | 9/2014 | Lee | H03K 5/1565 327/175 |
| 2021/0021271 A1* | 1/2021 | Chen | H03L 7/07 |

* cited by examiner

*Primary Examiner* — John W Poos
(74) *Attorney, Agent, or Firm* — Oliff PLC

(57) ABSTRACT

A duty cycle calibration circuit and method solves duty cycle calibration without single ended I/O signals. The calibration circuit includes driving circuit and voltage divider units, a low-pass filter, voltage controlled oscillator, digital processing unit, and duty cycle adjustment unit. The driving circuit unit outputs a clock signal for calibration; the voltage dividing unit divides voltage based on target duty cycle obtaining reference voltage; the low-pass filter performs low-pass filtering on the clock signal; the voltage controlled oscillator generates reference frequency corresponding to reference voltage and clock signal frequency corresponding to the clock signal based on reference voltage and filtered clock signal; the digital processing unit compares clock signal frequency with reference voltage frequency and generates a duty cycle adjustment control signal based on comparison result; and the duty cycle adjustment unit calibrates clock signal duty cycle based on the duty cycle adjustment control signal obtaining the target duty cycle.

9 Claims, 2 Drawing Sheets

DUTY CYCLE CALIBRATION CIRCUIT AND METHOD

CROSS-REFERENCE TO PRIOR APPLICATION

This application claims priority to Chinese Application number CN202211073889.7 which is filed on Sep. 2, 2022, the contents of which are incorporated herein by reference.

TECHNICAL FIELD

The disclosure generally relates to the technical field of integrated circuits, in particular to a duty cycle calibration circuit and method.

BACKGROUND

The current duty cycle calibration scheme usually uses a signal and its complementary signal to obtain a duty cycle error signal, and calibrates the duty cycle based on the error signal. For example, a duty cycle error signal is obtained by comparing signal A with the complementary signal $A_{BAR}$ of signal A. The duty cycle is then calibrated by amplifying this error signal. However, this method is difficult to apply to the signals without complementary signals, such as single ended input/output (I/O) signals in DDR.

SUMMARY OF THE INVENTION

An object of this application is to provide a duty cycle calibration circuit and method to solve the duty cycle calibration problem of signals without complementary signals (such as single ended I/O signals).

The application discloses a duty cycle calibration circuit, comprising:
- a driving circuit unit for outputting a clock signal to be calibrated;
- a voltage dividing unit connected to the driving circuit unit for voltage dividing based on a target duty cycle to obtain a reference voltage;
- a low-pass filter connected to the driving circuit unit for receiving the clock signal and performing low-pass filtering on the clock signal;
- a voltage controlled oscillator connected to the voltage dividing unit and the low-pass filter for generating a reference frequency corresponding to the reference voltage and a clock signal frequency corresponding to the clock signal based on the reference voltage and the filtered clock signal;
- a digital processing unit connected to the voltage controlled oscillator for comparing the clock signal frequency with the reference voltage frequency in digital domain and generating a duty cycle adjustment control signal based on comparison result; and
- a duty cycle adjustment unit connected to the digital processing unit for receiving the duty cycle adjustment control signal and calibrating the duty cycle of the clock signal based on the duty cycle adjustment control signal to obtain the target duty cycle.

In one embodiment, the reference voltage $V_{refer\_dc}=D\times(V_{HI}-V_{LO})+V_{LO}$, wherein $V_{refer\_dc}$ is the reference voltage, D is the target duty cycle, $V_{HI}$ is the high level of the clock signal, and $V_{LO}$ is the low level of the clock signal.

In one embodiment, the voltage dividing unit comprises a first resistor and a second resistor connected in series, one end of the first resistor is connected to a power supply, one end of the second resistor is connected to an output end of the driving circuit unit, and a node connected between the first resistor and the second resistor is connected to the voltage controlled oscillator, when obtaining the reference voltage, the voltage at the output end of the driving circuit unit is at low level.

In one embodiment, the low-pass filter comprises a third resistor and a capacitor, one end of the third resistor is connected to an output end of the driving circuit unit, the other end of the third resistor is connected to one end of the capacitor and the voltage controlled oscillator, and the other end of the capacitor is grounded.

In one embodiment, the calibration circuit further comprises a multiplexing switch, wherein the voltage dividing unit and the low-pass filter are connected to the voltage controlled oscillator via the multiplexing switch.

The application discloses a duty cycle calibration method, wherein the method is applied to a duty cycle calibration circuit which comprises a driving circuit unit, a voltage dividing unit, a low-pass filter, a voltage controlled oscillator, a digital processing unit, and a duty cycle adjustment unit, and the method comprises:
- obtaining a reference voltage by voltage dividing according to a target duty cycle via the voltage dividing unit;
- performing low-pass filtering by the low-pass filter on a clock signal to be calibrated output from the driving circuit unit;
- generating a reference frequency corresponding to the reference voltage and a clock signal frequency corresponding to the clock signal by the voltage controlled oscillator based on the reference voltage and the filtered clock signal;
- comparing the clock signal frequency with the reference frequency in digital domain and generating a duty cycle adjustment control signal based on comparison result by the digital processing unit; and
- calibrating the duty cycle of the clock signal by the duty cycle adjustment unit based on the duty cycle adjustment control signal.

In one embodiment, obtaining the reference voltage by voltage dividing according to the target duty cycle via the voltage dividing unit comprises:
- causing the voltage of an output end of the driving circuit unit to be at low level such that the voltage dividing unit obtains the reference voltage.

In one embodiment, generating the reference frequency corresponding to the reference voltage and the clock signal frequency corresponding to the clock signal by the voltage controlled oscillator based on the reference voltage and the filtered clock signal comprises:
- when receiving the reference voltage, the voltage controlled oscillator generates a reference frequency corresponding to the reference voltage and stores it in the digital processing unit;
- when receiving the filtered clock signal, the voltage controlled oscillator generates a clock signal frequency corresponding to the clock signal.

In one embodiment, comparing the clock signal frequency with the reference frequency in digital domain and generating the duty cycle adjustment control signal based on comparison result by the digital processing unit comprises:
- when receiving the clock signal frequency, the digital processing unit compares the clock signal frequency with stored reference frequency and generates a duty cycle adjustment control signal based on comparison result.

In the implementation method of this application, the reference voltage related to the target duty cycle is obtained by voltage dividing, and the reference frequency corresponding to the reference voltage is compared with the clock signal frequency corresponding to the clock signal in the digital domain. Based on the comparison result, the duty cycle of the clock signal is calibrated, thereby solving the duty cycle calibration problem of signals without complementary signals (such as single ended I/O signals).

DETAILED DESCRIPTION

In the following description, numerous technical details are set forth in order to provide the readers with a better understanding of the present application. However, those skilled in the art can understand that the technical solutions claimed in the present application can be implemented without these technical details and various changes and modifications based on the following embodiments.

Figure 1:
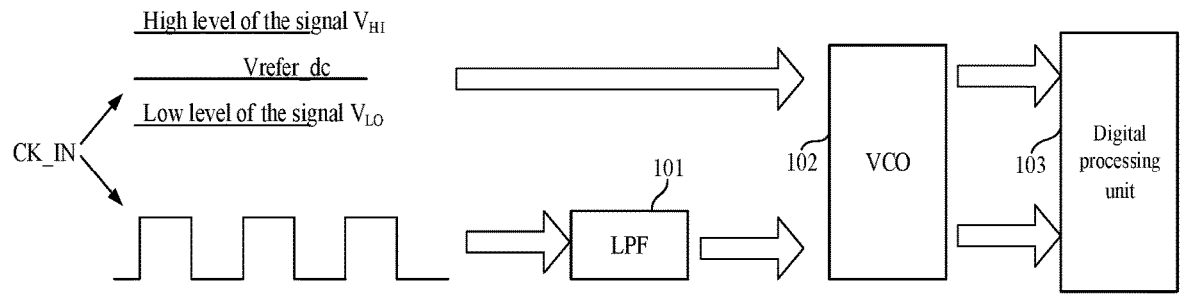
FIG. 1 shows a schematic diagram of basic principle for duty cycle calibration in an embodiment of the present application.

An embodiment of the present application discloses a duty cycle calibration circuit. FIG. 1 is a schematic diagram of the basic principle for duty cycle calibration in the present application, wherein the clock signal CK_IN is an input clock signal to be calibrated. Firstly, the high level $V_{HI}$ and the low level $V_{LO}$ of the clock signal CK_IN is divided according to a target duty cycle to obtain the reference voltage Vrefer_dc. The reference voltage Vrefer_dc is a DC voltage. The voltage controlled oscillator (VCO) 102 generates a reference frequency based on the reference voltage Vrefer_dc, and the reference frequency is corresponding to the reference voltage Vrefer_dc. Secondly, the low-pass filter (LPF) 101 performs low-pass filtering on the clock signal CK_IN, and then the voltage-controlled oscillator 102 generates a clock signal frequency based on the filtered clock signal CK_IN, the clock signal frequency is corresponding to the clock signal CK_IN. Next, the digital processing unit 103 compares the clock signal frequency with the reference voltage frequency in the digital domain and generates a duty cycle adjustment control signal based on the comparison result. Finally, the duty cycle adjustment unit (see in FIG. 2) calibrates the duty cycle of the clock signal CK_IN according to the duty cycle adjustment control signal to obtain the target duty cycle.

In this application, the reference voltage related to the target duty cycle is obtained by dividing the high level and low level of the clock signal, and the reference frequency corresponding to the reference voltage and the clock signal frequency corresponding to the clock signal are compared in the digital domain. Based on the comparison result, the duty cycle of the clock signal is calibrated, thereby solving the problem that it is difficult to generate duty cycle error signals for duty cycle calibration without complementary signals (such as single ended I/O signals).

Figure 2:
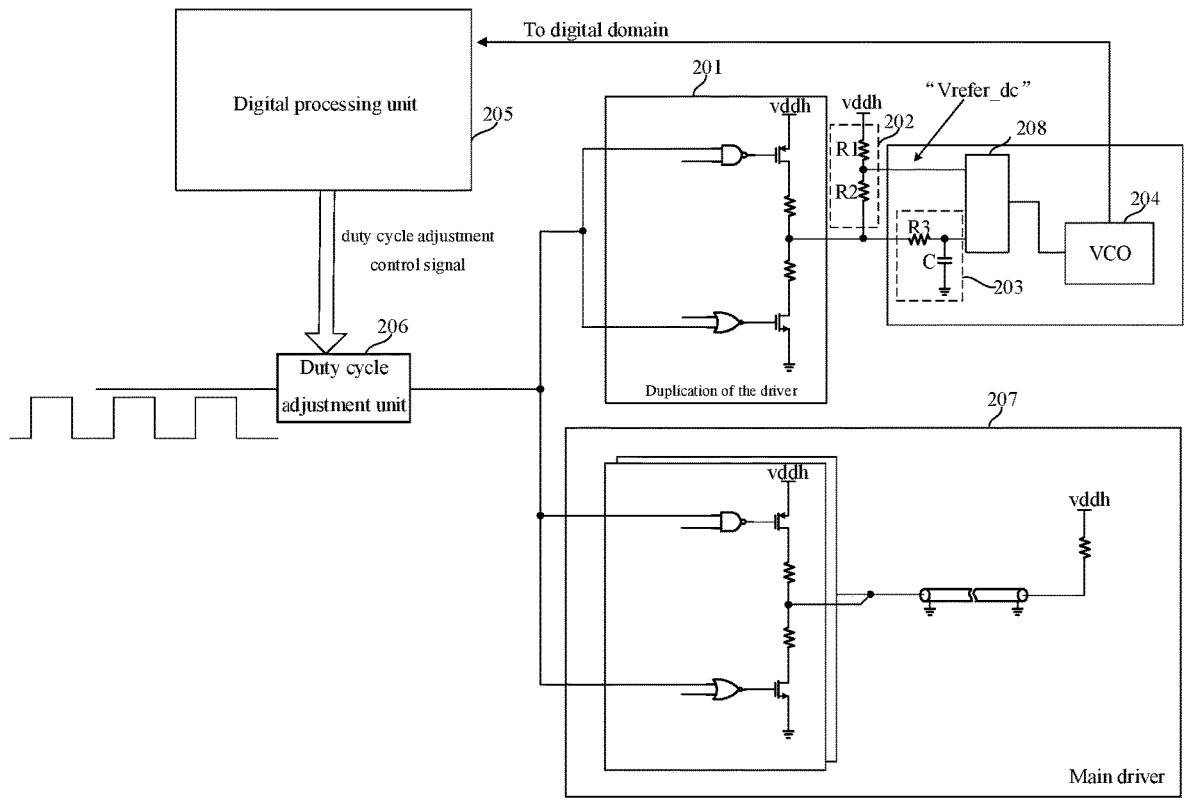
FIG. 2 shows a schematic diagram of a circuit for duty cycle calibration in an embodiment of the present application.

FIG. 2 shows a schematic diagram of a circuit for duty cycle calibration in an embodiment of the present application. The duty cycle calibration circuit includes a driving circuit unit 201, a voltage dividing unit 202, a low-pass filter 203, a voltage controlled oscillator 204, a digital processing unit 205, and a duty cycle adjustment unit 206. The driving circuit unit 201 is configured to output a clock signal to be calibrated. The voltage dividing unit 202 is connected to the driving circuit unit 201 and configured to divide the voltage based on a target duty cycle to obtain a reference voltage. The low-pass filter 203 is connected to the driving circuit unit 201 and configured to receive the clock signal and perform low-pass filtering on the clock signal. The voltage controlled oscillator 204 is connected to the voltage dividing unit 202 and the low-pass filter 203, and configured to generate a reference frequency corresponding to the reference voltage and a clock signal frequency corresponding to the clock signal based on the reference voltage and the filtered clock signal. The digital processing unit 205 is connected to the voltage controlled oscillator 204 and configured to compare the clock signal frequency with the reference voltage frequency in digital domain and generate a duty cycle adjustment control signal based on comparison result. The duty cycle adjustment unit 206 is connected to the digital processing unit 205, and configured to receive the duty cycle adjustment control signal and calibrate the duty cycle of the clock signal based on the duty cycle adjustment control signal to obtain the target duty cycle.

In one embodiment, the driving circuit unit 201 in the calibration circuit may be a duplication of a portion of the driving circuit in the main driver 207, that is, the driving circuit unit 201 is formed by duplicating a portion of the driving circuit in the main driver 207, so that the clock signal outputted from the driving circuit unit 201 is the same as that outputted from the main driver 207, and the driving circuit unit 201 may be used to participate in the duty cycle calibration process instead of the main driver. After the calibration is completed, the parameters of the calibration may be recorded and used to calibrate the clock signal of the main driver 207.

In one embodiment, the reference voltage $V_{refer\_dc}=D \times (V_{HI}-V_{LO})+V_{LO}$, wherein $V_{refer\_dc}$ is the reference voltage, D is the target duty cycle, $V_{HI}$ is the high level of the clock signal, and $V_{LO}$ is the low level of the clock signal. It can be understood that the target duty cycle D can be set according to the actual needs of the circuit. Usually, the target duty cycle D can be 50%, and of course, it can also be other setting values, such as 30%, 40%, 60%, etc.

Continuing to refer to FIG. 2, the voltage dividing unit 202 comprises a first resistor R1 and a second resistor R2 connected in series. One end of the first resistor R1 is connected to a power supply vddh, one end of the second resistor R2 is connected to an output end of the driving circuit unit 201, and a node connected between the first resistor R1 and the second resistor R2 is connected to the voltage controlled oscillator 204. When obtaining the reference voltage, the voltage at the output end of the driving circuit unit 201 is at low level. In an embodiment, the resistance values of the first resistor R1 and the second resistor R2 may be, for example, 840 ohms.

In one embodiment, the low-pass filter 203 comprises a third resistor R3 and a capacitor C, one end of the third resistor R3 is connected to an output end of the driving circuit unit 201, the other end of the third resistor R3 is connected to one end of the capacitor C and the voltage controlled oscillator 204, and the other end of the capacitor C is grounded. It can be understood that the low-pass filter 203 extracts the DC component of the clock signal.

In one embodiment, the calibration circuit further comprises a multiplexing switch 208, wherein the voltage dividing unit 202 and the low-pass filter 203 are connected to the voltage controlled oscillator 204 via the multiplexing switch 208.

In one embodiment, the reference voltage and the filtered clock signal are respectively input to the voltage controlled oscillator 204 by controlling the multiplexing switch 208. When receiving the reference voltage, the voltage controlled oscillator 204 generates a reference frequency corresponding to the reference voltage and sends it to the digital processing unit 205 for storage. When receiving the clock signal, the voltage controlled oscillator 204 generates a clock signal frequency corresponding to the clock signal and sends it to the digital processing unit 205. The digital processing unit 205 compares the clock signal frequency with the stored reference frequency and generates a duty cycle adjustment control signal based on the comparison result.

The duty cycle adjustment unit 206 calibrates the duty cycle of the clock signal based on the duty cycle adjustment control signal. The duty cycle adjustment unit 206 includes a multi-stage inverter, and the process of adjusting the clock signal may be to adjust the strength of each of the stages of the inverter to adjust the rising edge and the falling edge of the clock signal, thereby adjusting the duty cycle of the clock signal. The present application solves the problem that it is difficult for a DDR IO without a complementary signal to generate a duty cycle error signal for duty cycle calibration.

Figure 3:
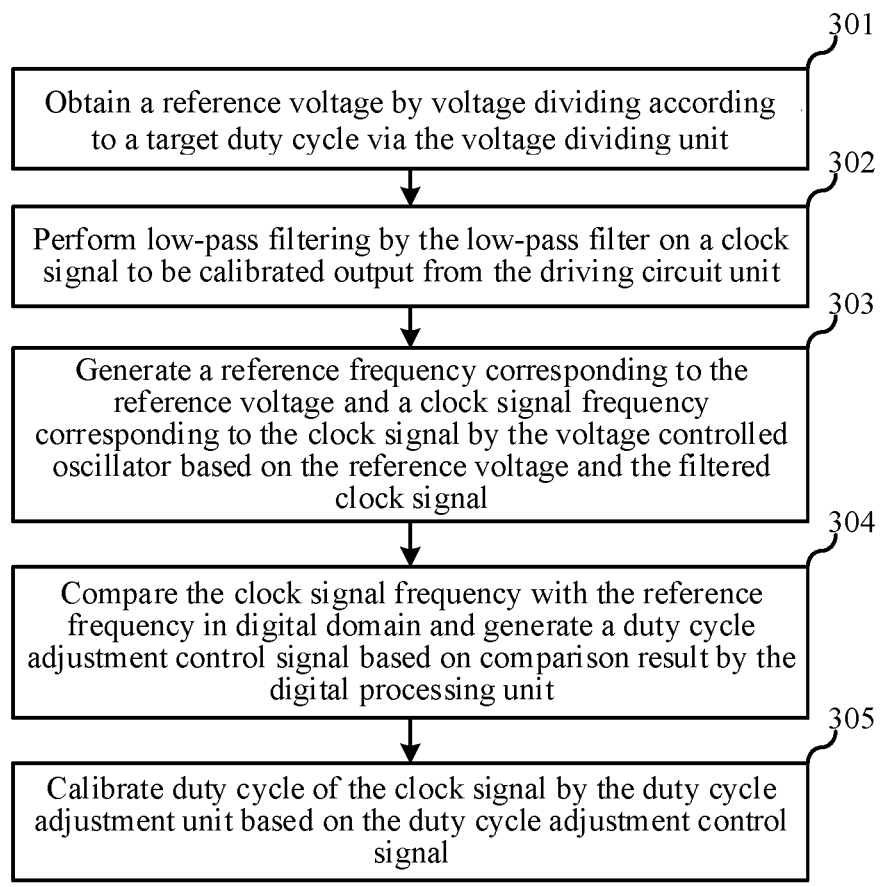
FIG. 3 shows a schematic flow of a duty cycle calibration method in an embodiment of the present application.

Another embodiment of the present application also discloses a duty cycle calibration method, the method can be applied to the duty cycle calibration circuit in the above embodiments, the calibration circuit comprises the driving circuit unit 201, the voltage dividing unit 202, the low-pass filter 203, the voltage controlled oscillator 204, the digital processing unit 205, and the duty cycle adjustment unit 206. FIG. 3 shows a schematic flow of the calibration method in an embodiment of the present application, the method comprises:

Step 301, a reference voltage is obtained by dividing the voltage according to a target duty cycle via the voltage dividing unit 202.

One end of the voltage dividing unit 202 is connected to the power supply and the other end is connected to the output of the driving circuit unit 201 so that the voltage at the output of the driving circuit unit 205 is at low level to enable the voltage dividing unit 202 to obtain the reference voltage.

In one embodiment, the reference voltage $V_{refer\_dc} = D \times (V_{HI} - V_{LO}) + V_{LO}$, wherein $V_{refer\_dc}$ is the reference voltage, D is the target duty cycle, $V_{HI}$ is the high level of the clock signal, and $V_{LO}$ is the low level of the clock signal.

Step 302, the low-pass filter 203 performs low-pass filtering on the clock signal to be calibrated output from the driving circuit unit 201.

Step 303, the voltage controlled oscillator 204 generates a reference frequency corresponding to the reference voltage and a clock signal frequency corresponding to the clock signal based on the reference voltage and the filtered clock signal.

Typically, firstly when receiving the reference voltage, the voltage controlled oscillator 204 generates the reference frequency corresponding to the reference voltage and stores it to the digital processing unit. Then, when receiving the filtered clock signal, the voltage controlled oscillator 204 generates the clock signal frequency corresponding to the clock signal. In this embodiment, the same voltage controlled oscillator 204 can be multiplexed, and two voltage controlled oscillators may be employed for receiving the reference voltage and the filtered clock signal, respectively.

Step 304, the digital processing unit 205 compares the clock signal frequency with the reference voltage frequency in digital domain and generates a duty cycle adjustment control signal based on comparison result.

In one embodiment, comparing the clock signal frequency with the reference frequency in digital domain and generating a duty cycle adjustment control signal based on comparison result by the digital processing unit comprises: when receiving the clock signal frequency, the digital processing unit compares the clock signal frequency with the reference voltage frequency and generates the duty cycle adjustment control signal based on the comparison result.

Step 305, the duty cycle adjustment unit 206 calibrates the duty cycle of the clock signal based on the duty cycle adjustment control signal.

It should be noted that in this specification of the application, relational terms such as the first and second, and so on are only configured to distinguish one entity or operation from another entity or operation, and do not necessarily require or imply any such actual relationship or order between these entities or operations. Furthermore, the term "comprises" or "comprising" or "includes" or any other variations thereof is intended to encompass a non-exclusive inclusion, such that a process, method, article, or device that comprises a multiple elements includes not only those elements but also other elements, or elements that are inherent to such a process, method, item, or device. Without more restrictions, the element defined by the phrase "comprise(s) a/an" does not exclude that there are other identical elements in the process, method, item or device that includes the element. In this specification of the application, if it is mentioned that an action is performed according to an element, it means the meaning of performing the action at least according to the element, and includes two cases: the action is performed only on the basis of the element, and the action is performed based on the element and other elements. Multiple, repeatedly, various, etc., expressions include 2, twice, 2 types, and 2 or more, twice or more, and 2 types or more types.

The specification includes combinations of the various embodiments described herein. Separate references to embodiments (such as "an embodiment" or "some embodiments" or "preferred embodiments") do not necessarily refer to the same embodiment; however, these embodiments are not mutually exclusive unless indicated as mutually exclusive or clearly mutually exclusive by those skilled in the art. It should be noted that unless the context clearly indicates or requires otherwise, the word "or" is used in this specification in a non-exclusive sense.

All documents mentioned in this specification are considered to be included in the disclosure of this application as a whole, so that they can be used as a basis for modification when necessary. In addition, it should be understood that the above descriptions are only preferred embodiments of this specification, and are not intended to limit the protection scope of this specification. Any modification, equivalent replacement, improvement, etc. made within the spirit and principle of one or more embodiments of this specification should be included in the protection scope of one or more embodiments of this specification.

What is claimed is:

1. A duty cycle calibration circuit, comprising:
   a driving circuit unit for outputting a clock signal to be calibrated;

a voltage dividing unit connected to the driving circuit unit for voltage dividing based on a target duty cycle to obtain a reference voltage, wherein one end of the voltage dividing unit is connected to a power supply and the other end of the voltage dividing unit is connected to an output end of the driving circuit unit, and when obtaining the reference voltage, the voltage at the output end of the driving circuit unit is at low level;

a low-pass filter connected to the driving circuit unit for receiving the clock signal and performing low-pass filtering on the clock signal;

a voltage controlled oscillator connected to the voltage dividing unit and the low-pass filter for generating a reference frequency corresponding to the reference voltage and a clock signal frequency corresponding to the clock signal based on the reference voltage and the filtered clock signal;

a digital processing unit connected to the voltage controlled oscillator for comparing the clock signal frequency with the reference voltage frequency in digital domain and generating a duty cycle adjustment control signal based on comparison result; and a duty cycle adjustment unit connected to the digital processing unit for receiving the duty cycle adjustment control signal and calibrating duty cycle of the clock signal based on the duty cycle adjustment control signal to obtain the target duty cycle.

2. The duty cycle calibration circuit according to claim 1, wherein the reference voltage $V_{refer\_dc}=D\times(V_{HI}-V_{LO})+V_{LO}$, wherein $V_{refer\_dc}$ is the reference voltage, D is the target duty cycle, $V_{HI}$ is a high level of the clock signal, and $V_{LO}$ is a low level of the clock signal.

3. The duty cycle calibration circuit according to claim 1, wherein the voltage dividing unit comprises a first resistor and a second resistor connected in series, one end of the first resistor is connected to a power supply, one end of the second resistor is connected to an output end of the driving circuit unit, and a node connected between the first resistor and the second resistor is connected to the voltage controlled oscillator.

4. The duty cycle calibration circuit according to claim 1, wherein the low-pass filter comprises a third resistor and a capacitor, one end of the third resistor is connected to an output end of the driving circuit unit, the other end of the third resistor is connected to one end of the capacitor and the voltage controlled oscillator, and the other end of the capacitor is grounded.

5. The duty cycle calibration circuit according to claim 1, wherein the calibration circuit further comprises a multiplexing switch, wherein the voltage dividing unit and the low-pass filter are connected to the voltage controlled oscillator via the multiplexing switch.

6. A duty cycle calibration method, wherein the method is applied to a duty cycle calibration circuit which comprises a driving circuit unit, a voltage dividing unit, a low-pass filter, a voltage controlled oscillator, a digital processing unit, and a duty cycle adjustment unit, wherein one end of the voltage dividing unit is connected to a power supply and the other end of the voltage dividing unit is connected to an output end of the driving circuit unit, the method comprises:

obtaining a reference voltage by voltage dividing according to a target duty cycle via the voltage dividing unit, and causing a voltage at the output end of the driving circuit unit to be at low level such that the voltage dividing unit obtains the reference voltage;

performing low-pass filtering by the low-pass filter on a clock signal to be calibrated output from the driving circuit unit;

generating a reference frequency corresponding to the reference voltage and a clock signal frequency corresponding to the clock signal by the voltage controlled oscillator based on the reference voltage and the filtered clock signal;

comparing the clock signal frequency with the reference frequency in digital domain and generating a duty cycle adjustment control signal based on comparison result by the digital processing unit; and calibrating duty cycle of the clock signal by the duty cycle adjustment unit based on the duty cycle adjustment control signal.

7. The duty cycle calibration method according to claim 6, wherein generating the reference frequency corresponding to the reference voltage and the clock signal frequency corresponding to the clock signal by the voltage controlled oscillator based on the reference voltage and the filtered clock signal comprises:

when receiving the reference voltage, the voltage controlled oscillator generates a reference frequency corresponding to the reference voltage and stores it in the digital processing unit;

when receiving the filtered clock signal, the voltage controlled oscillator generates a clock signal frequency corresponding to the clock signal.

8. The duty cycle calibration method according to claim 6, wherein comparing the clock signal frequency with the reference frequency in digital domain and generating the duty cycle adjustment control signal based on comparison result by the digital processing unit comprises:

when receiving the clock signal frequency, the digital processing unit compares the clock signal frequency with stored reference frequency and generates a duty cycle adjustment control signal based on comparison result.

9. The duty cycle calibration method according to claim 6, wherein the reference voltage $V_{refer\_dc}=D\times(V_{HI}-V_{LO})+V_{LO}$, wherein $V_{refer\_dc}$ is the reference voltage, D is the target duty cycle, $V_{HI}$ is a high level of the clock signal, and $V_{LO}$ is a low level of the clock signal.

\* \* \* \* \*